(12) United States Patent
Houck

(10) Patent No.: US 9,542,305 B2
(45) Date of Patent: Jan. 10, 2017

(54) IMPEDANCE MATCHING FOR HIGH SPEED SIGNALING IN MEMORY SYSTEM

(71) Applicant: Harman International Industries, Inc., Stamford, CT (US)

(72) Inventor: Thomas J. Houck, South Lyon, MI (US)

(73) Assignee: Harman International Industries, Inc., Stamford, CT (US)

( * ) Notice: Subject to any disclaimer, the term of this patent is extended or adjusted under 35 U.S.C. 154(b) by 0 days.

(21) Appl. No.: 14/598,505

(22) Filed: Jan. 16, 2015

(65) Prior Publication Data

US 2016/0211844 A1 Jul. 21, 2016

(51) Int. Cl.
| | |
|---|---|
| *G06F 12/00* | (2006.01) |
| *G06F 13/00* | (2006.01) |
| *H03K 19/00* | (2006.01) |
| *G11C 5/06* | (2006.01) |
| *G11C 11/4093* | (2006.01) |
| *H05K 3/30* | (2006.01) |
| *G01R 25/00* | (2006.01) |
| *H04L 5/14* | (2006.01) |

(52) U.S. Cl.
CPC ............... *G06F 12/00* (2013.01); *G06F 13/00* (2013.01); *G11C 5/06* (2013.01); *G11C 11/4093* (2013.01); *H03K 19/0005* (2013.01); *H05K 3/303* (2013.01); *G01R 25/00* (2013.01); *H04L 5/1407* (2013.01)

(58) Field of Classification Search
CPC ..... G11C 11/4093; G11C 5/06; G11C 7/1093; G11C 29/025; H03K 19/0005; H03K 19/017545; H05K 3/303; H01L 2224/48227; H01L 2924/3011; H01L 25/0657
See application file for complete search history.

(56) References Cited

U.S. PATENT DOCUMENTS

| | | | | |
|---|---|---|---|---|
| 3,585,399 | A * | 6/1971 | Andrews, Jr. ......... | H04L 5/1407 326/30 |
| 5,594,376 | A * | 1/1997 | McBride ................ | G01R 25/00 327/146 |
| 6,356,105 | B1 | 3/2002 | Volk | |
| 6,442,644 | B1 * | 8/2002 | Gustavson .......... | G06F 13/4243 365/194 |
| 8,384,423 | B2 | 2/2013 | Nguyen et al. | |
| 2003/0043683 | A1 * | 3/2003 | Funaba .................. | G11C 5/063 365/230.03 |
| 2007/0101168 | A1 | 5/2007 | Atkinson | |
| 2009/0300260 | A1 * | 12/2009 | Woo .................... | G06F 13/4243 710/316 |

(Continued)

OTHER PUBLICATIONS

Micron Technology, Inc., "TN-46-14: Hardware Tips for Point-to-Point System Design", 2006, pp. 1-16.

*Primary Examiner* — Richard Elms
*Assistant Examiner* — Ajay Ojha
(74) *Attorney, Agent, or Firm* — Brooks Kushman P.C.

(57) ABSTRACT

Impedance matching circuitry is positioned on a signal line intermediate the terminals of the signal line in an integrated circuit. The impedance matching circuitry can include discrete components off the integrated circuit and on a substrate, e.g., a board. The impedance matching circuitry can operate to match the impedance of a signal line in the integrated circuit, e.g., a memory device such as a DRAM or DDR DRAM.

19 Claims, 8 Drawing Sheets

(56) References Cited

U.S. PATENT DOCUMENTS

2013/0097577 A1* 4/2013 Byrne ................ G06F 17/5081
716/137
2014/0253173 A1* 9/2014 Chun .................. G06F 13/4086
326/30

* cited by examiner

IMPEDANCE MATCHING FOR HIGH SPEED SIGNALING IN MEMORY SYSTEM

TECHNICAL FIELD

Aspects as disclosed herein generally relate to impedance matching circuitry, which may operate as a high speed signal aid. The impedance matching circuitry is positioned intermediate to ends of a signal line in an integrated circuit.

BACKGROUND

Signal integrity is important in high speed integrated circuit devices, e.g., greater than 400 MHz. Absent signal integrity access to data and data processing may be hampered. The effects of impedance on signal integrity increase with increases in signal speed. In some applications, it is necessary to evaluate the signal integrity in a package/board on which the memory, e.g., DRAM or NAND flash memory is mounted. Traditionally, impedance matching is performed at the terminal ends of a signal line. However, when adding impedance matching at the ends of a signal line, it may be required to reroute signal lines, which can complicate board layouts.

SUMMARY

A digital signal aid is described that can be used to solve signal integrity issues, e.g., in signal lines of integrated circuits. In an example, an impedance matching network is positioned intermediate a memory controller and memory circuits connected thereto. In an example, the memory circuits can be double data rate (DDR) memory circuits.

An electronic assembly is described that can include a memory device, a substrate and an impedance matching circuit. The memory device can include a memory cell and a first communication line in electrical communication with the memory cell, wherein the first communication line is elongate and has a first end connected to the memory cell and a second end. The substrate can include a second communication line connected to the second end and extending therefrom. The impedance matching circuit can be connected to the second end.

In an example, the impedance matching circuit is remote from the first end and remote from a third end of the second communication line. The impedance matching circuit can be positioned at least 90% of a length of the first communication line from the first end. The impedance matching circuit is positioned at least 90% of a length of the second communication line from the third end of the second communication line. In an example, the impedance matching circuit is not in-die and includes discrete components positioned at a via on the substrate.

A memory device can include a memory controller, a clock line with a first end connected to the memory controller and a second end, a first DDR memory device connected to the second end and having a first impedance, a second DDR memory device connected to the second end and having a second impedance, and impedance matching circuitry connected to the second end and configured to match line impedances.

In an example, the memory device can further include a via at the second end, the via being connected to the clock line, the first DDR memory device, the second DDR memory device and the impedance matching circuitry.

In an example, the impedance matching circuitry includes a voltage divider with a center tap being connected to the via.

In an example, the impedance matching circuitry includes a capacitor in parallel with the voltage divider.

In an example, the impedance matching circuitry includes a voltage divider with a center tap being connected to the via.

In an example, the impedance matching circuitry is positioned intermediate the first memory device, the second memory device and the clock circuit.

BRIEF DESCRIPTION OF THE DRAWINGS

FIGS. 4, 4A and 4B are schematic views of circuit representation of clock lines for an integrated circuit according to an example with FIG. 4 showing how FIG. 4A relates to FIG. 4B.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

High speed electrical signal experience integrity issues which must be taken into account when designing a high-speed device, e.g., double data rate (DDR) memory devices and other integrated circuits. In particular, clock lines, upon which many integrated circuits rely on for accurate performance, must have reliable signals to reduce operation errors in the integrated circuit. In particular, signal integrity is important in DDR DRAM differential clock signals. However, the layout of integrated circuits is fixed in place at the time of fabrication and any impedance matching is done at the end terminal of a signal line. Moreover, any other changes to an integrated circuit are difficult and require a significant design change to fix signal integrity issues. The present inventor has recognized that there is a need for an improved method and structure to correct any signal line integrity issues. To address this need and possibly others, a mid-transmission line, high speed, impedance matching network is used. Positioning the impedance matching network at a mid-point aids in improving signal integrity while not requiring a redesign of the integrated circuit. For example, trace lines need not be rerouted as moving those would result in the recalculating trace length impedance matching. In an example, the impedance matching network can be connected to the signal at a via, where two transmission lines are joined. The impedance matching network can include discrete components, e.g., passive elements and active elements, on the integrated circuit package, packaged with the IC or on a board supporting the IC. Connecting the impedance matching network mid-line at the via reduces the power line routing and signal routing for the impedance matching network.

Figure 1:
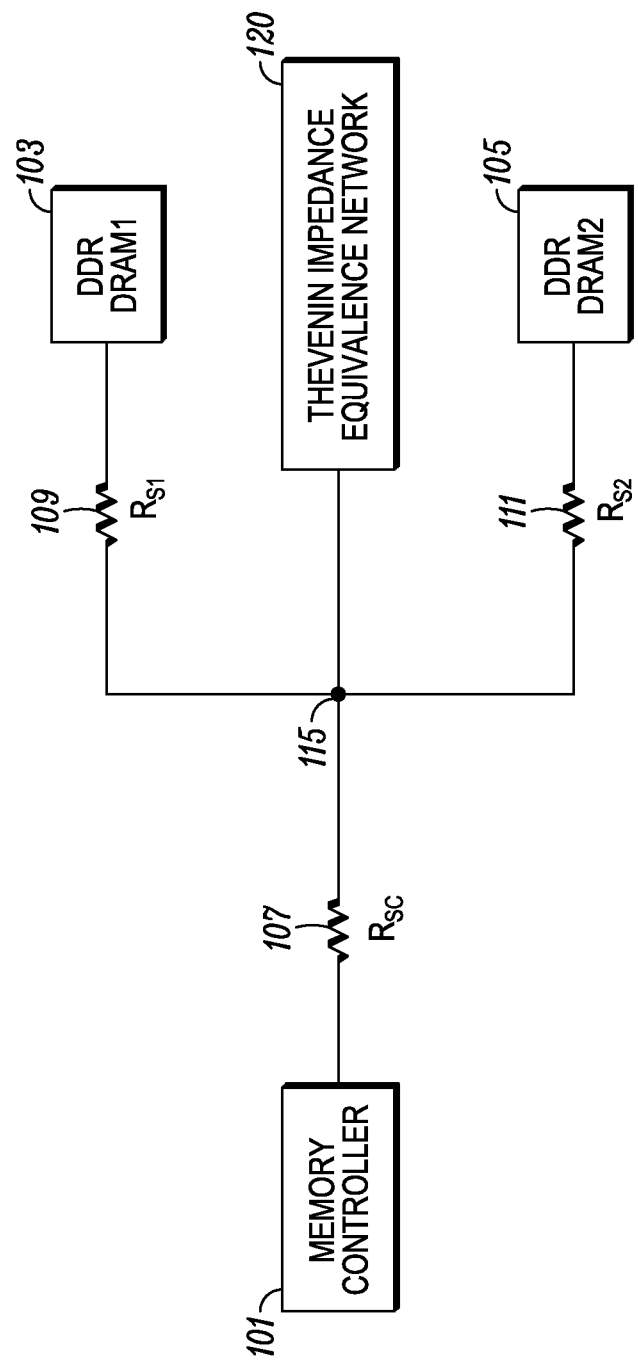
FIG. 1 is a view of a memory system according to an example.

FIG. 1 shows an integrated circuit system as a memory device. A memory controller 101 operates with a first memory unit 103 and a second memory unit 105. Memory units 103, 105 can be DRAM devices and can be DDR DRAM devices. While the memory controller 101 and the memory units 103, 105 can be packaged together, they are electrically separate and remote from each other. A signal line 107 connects the memory controller 101 to a node 115. The signal line 107 has impedance, e.g., Rsc. A signal line 109 connects the first memory unit 103 to the node 115. The signal line 109 has an impedance, e.g., $Rs_1$. A signal line 111 connects the second memory unit 105 to the node 115. The signal line 111 has an impedance, e.g., $Rs_2$. The node 115 can include a via in the integrated circuit construction. An impedance matching network 120 is electrically connected to the node 115 and is electrically and physically remote from the memory controller 101 and the memory units 103, 105. The impedance matching network 120 can include passive components and active components. Such components can be discrete components, which can be mounted on a board. The impedance matching network 120 is selected to match the impedance(s) of the signal lines 107, 109, 111.

Figure 2:
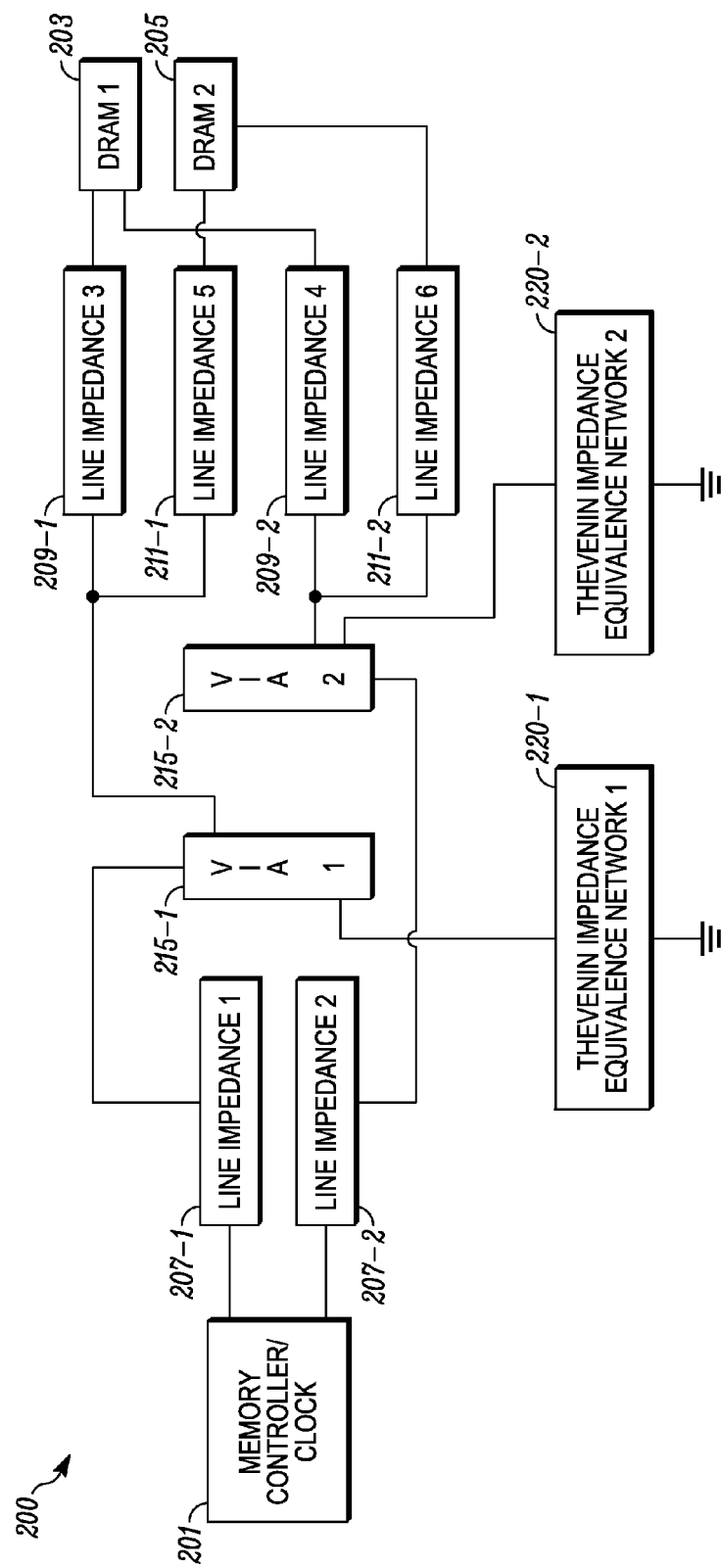
FIG. 2 is a view of a memory system according to an example.

FIG. 2 shows an integrated circuit system 200 with two impedance matching networks 220-1 and 220-2 with each matching the impedance of different signal lines 207-1 and 207-2 of a differential signal line pair from the memory controller 201. The differential signal lines 207-1 and 207-2 can be differential clock lines for the integrated circuit system. It will be noted that a numbering system similar to FIG. 1 is used in FIG. 2 with the most significant digit being replaced with the figure number and suffixed added to indicate the different lines as associated structures. In an example, the memory controller 201 and the memory units 203, 205 can be packaged together, they are electrically separate and remote from each other. Signal lines 207-1, 207-2, 209-1, 209-2, 211-1 and 211-2 electrically connect the memory controller 201 and the memory units 203, 205 and provide communication for high speed IC signal therebetween. Signal line 207-1 connects the memory controller 201 to a node 215-1. The signal line 207-1 has an impedance that can affect the signal being transmitted therethrough. Signal line 207-2 connects the memory controller 201 to a node 215-2. The signal line 207-2 has an impedance that can affect the signal being transmitted therethrough and can be different than the impedance of signal line 207-1. Node 215-1 is different than node 215-2 but can be positioned relatively close to node 215-2. A signal line 209-1 connects the first memory unit 203 to the node 215-1. The signal line 209-1 has an impedance that may affect the signal therethrough. A signal line 209-2 connects the first memory unit 203 to the node 215-2. The signal line 209-2 has an impedance that may affect the signal therethrough. A signal line 211-1 connects the second memory unit 205 to the node 215-1. The signal line 211-1 has an impedance that may affect the signal therethrough. A signal line 211-2 connects the second memory unit 205 to the node 215-2. The signal line 211-2 has an impedance that may affect the signal therethrough. The nodes 215-1 and 215-2 can include a via in the integrated circuit construction. An impedance matching network 220-1 is electrically connected to the node 215-1 and is electrically and physically remote from the memory controller 201 and the memory units 203, 205. An impedance matching network 220-2 is electrically connected to the node 215-2 and is electrically and physically remote from the memory controller 201 and the memory units 203, 205. The impedance matching networks 220-1 and 220-2 can include passive components and active components. Such components can be discrete components, which can be mounted on a board. The impedance matching networks 220-1 and/or 220-2 are selected to match the impedance(s) of the signal lines 207, 209, 211. It will further be recognized that only one impedance matching network, e.g., 220-1, is used in an example.

Figure 3:
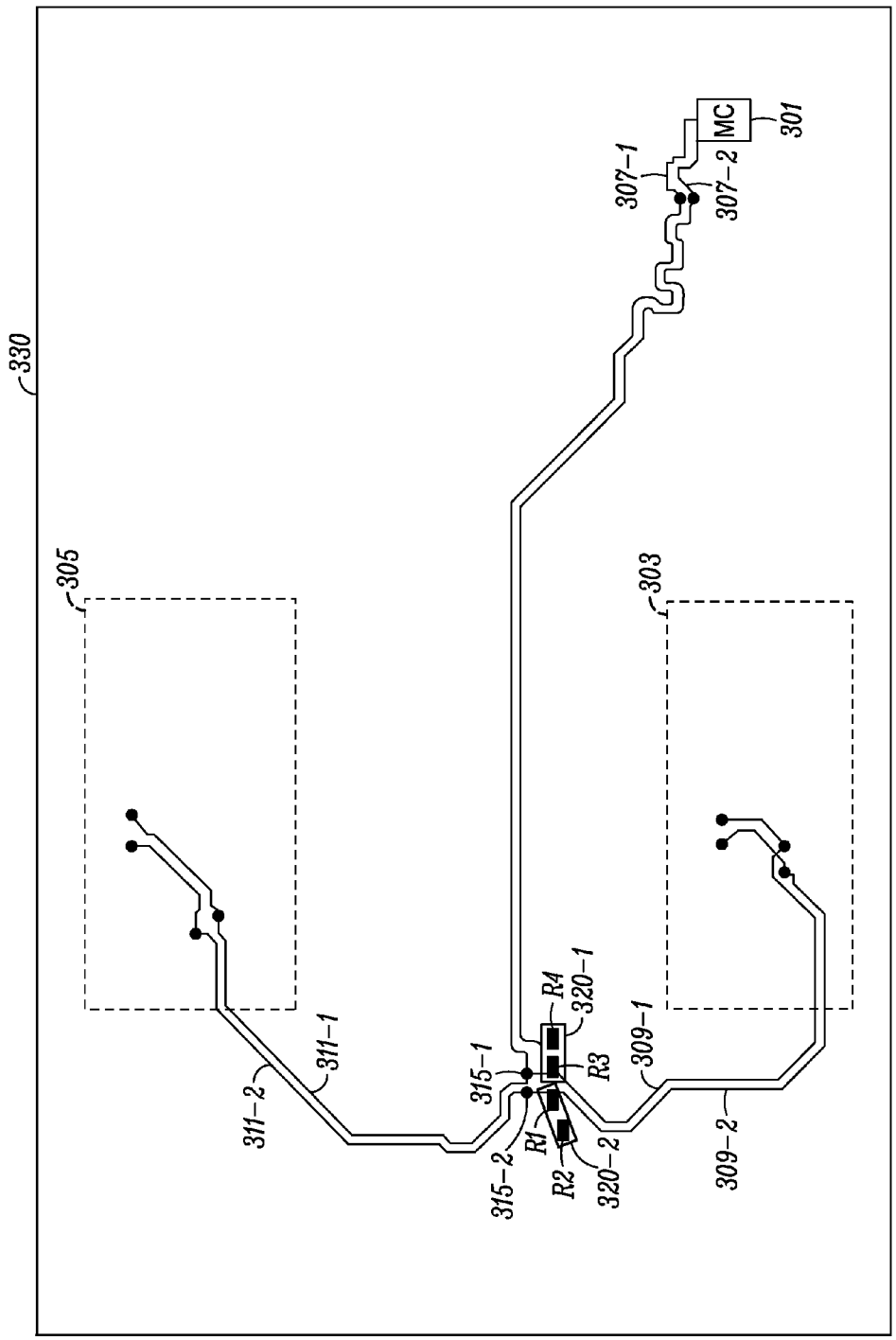
FIG. 3 is a schematic view of trace lines in a memory according to an example.

FIG. 3 shows a schematic layout of signal lines in a fabrication, e.g., a printed circuit board (PCB) 330, according to an embodiment of the present invention. A plurality of electronic components may be positioned in and on the fabrication. The positioning of such components may dictate the placement of signal lines 307, 309, and 311 to avoid the components on the fabrication 330 or substrate. The placement of the other components and the needs for the signal lines to avoid these components causes the signal lines to have a serpentine layout. Such serpentine layouts can cause the signal lines 307, 309, and 311 to have additional impedances. Serpentine layouts of the signal lines 307, 309, and 311 results in the multiple turns in the signal lines and in some layouts include non-right angle turns. The memory controller 301 is connected to signal lines 307-1, 307-2 to node 315-1, 315-2. Memory device 303, 305 are connected to nodes 315-1, 315-2 by signal lines 309-1, 309-2 and 311-1, 311-2, respectively. Impedance matching circuits 320-1 and 320-2 are electrically connected to the nodes 315-1, 315-2. The nodes 315-1, 315-2 can be vias or other trace line connections. As shown, the impedance matching circuits 320-1, 320-2 are positioned close to the nodes 315-1, 315-2 and remote from the memory controller 301 and the memory devices 303, 305. In an example, the impedance matching circuits 320-1, 320-2 are vertically displaced relative to the signal lines and can be positioned over at least one of the signal lines. In an example, the nodes 315-1, 315-2 are positioned about half way between the memory devices and the memory controller, +/−10%, 20% or 25%. The impedance matching circuits 320-1, 320-2 are positioned about halfway (+/−10%, 20% or 25%). between the memory devices and the memory controller. The impedance matching circuits 320-1, 320-2 can include two resistors, which can be connected in series, with one end connected to the node 315-1, 315-2, respectively and the other end connected to a low noise source.

Figure 4A:
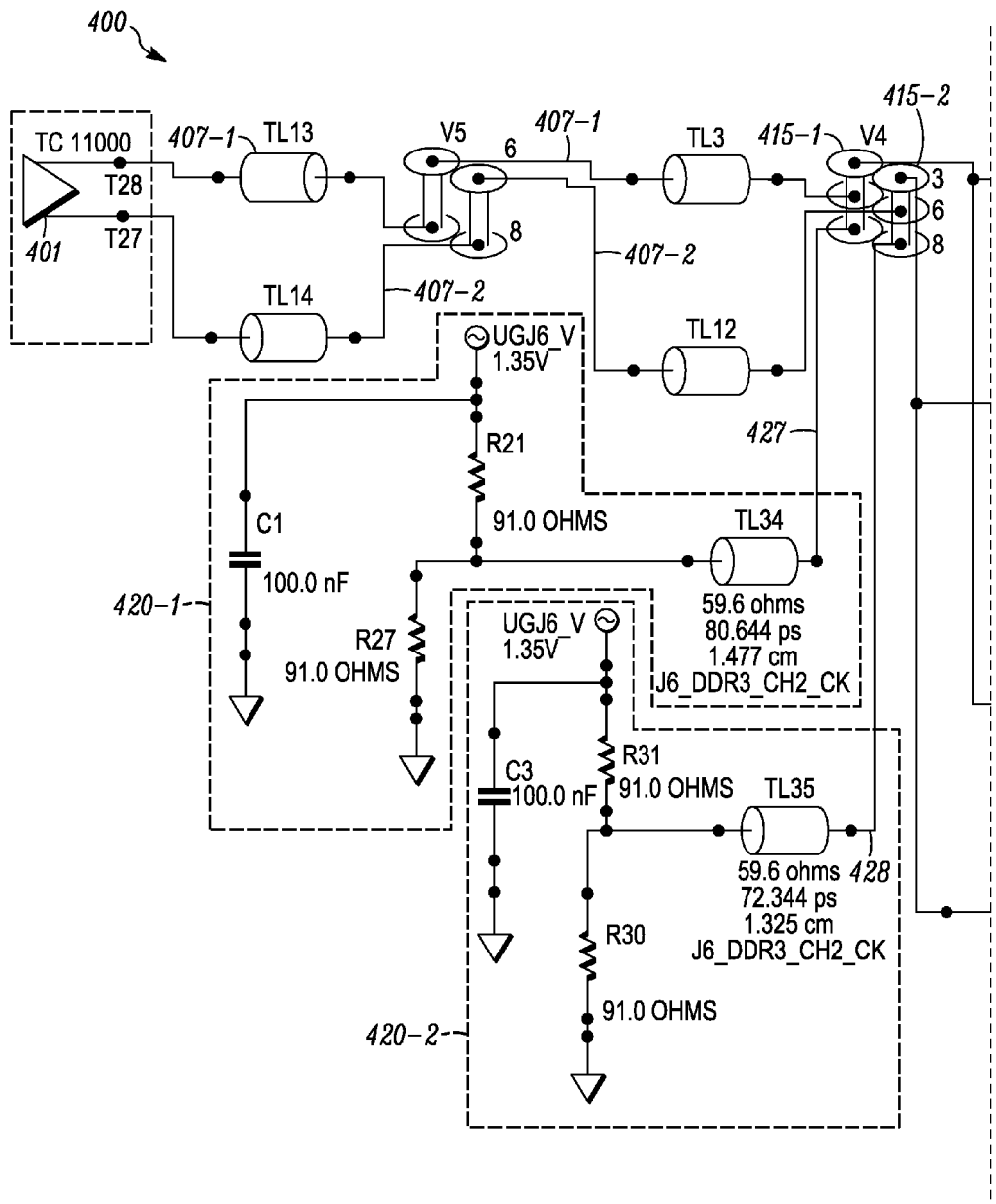
Figure 4B:
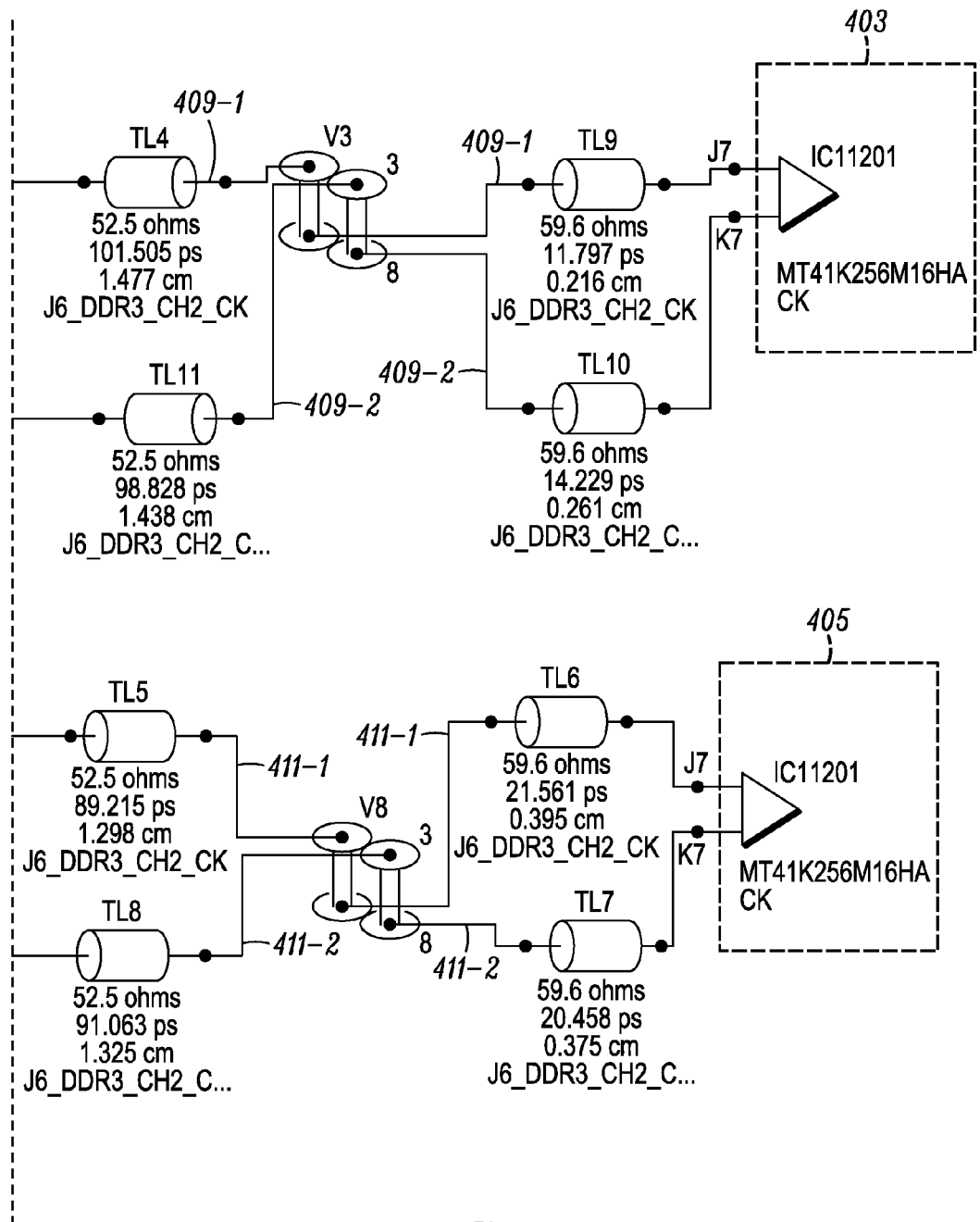

FIG. 4 shows circuit layout 400 for part of an electronic system with impedance matching according to an embodiment of the present disclosure. A memory controller 401 or differential clock is connected to two signal lines 407-1 and 407-2. Each signal line 407-1 and 407-2 can have a first impedance, a connection via and a second impedance. Ideally, both the impedances on both sides of the via have the same impedance, e.g., 50 Ohms. However, due to fabrication variances, the impedances may not match and may be up to about 15% different from each other. The signal lines 407-1 and 407-2 are connected at their distal ends to the nodes 415-1, 415-2, which are vias in the integrated circuit. Additional signal line pairs 409-1, 409-2 and 411-1, 411-2 extend from nodes 415-1 and 415-2 and electrically connect to memory device 403 and 405. Accordingly, the signal lines form a T-connection from the controller 401 to the memory device 403, 405. Each of signal lines 409-1, 409-2 and 411-1, 411-2 can have a first impedance and a second impedance separated by a via. The impedances on each side of the vias may not match. Additionally, the vias themselves may introduce some variability in the actual impedances of the device that is different than the design or theoretical value.

First impedance matching circuitry 420-1 is connected to the first node 415-1, which is connected to signal lines 407-1, 409-1 and 411-1. Second impedance matching circuitry 420-2 is connected to the second node 420-1, which is connected to signal lines 407-2, 409-2 and 411-2. Each impedance matching circuitry 420-1, 420-2 has line impedances of signal lines 427, 428 and other impedance components. As shown in FIG. 4, a voltage divider circuit is connected to the signal line 427, 428 and can include series connected resistors with a center node connected to the signal line 427 or 428, a positive node connected to a voltage source and a negative node connected to ground. In an example, a capacitor is connected in parallel with the resistor pair. The capacitor can reduce voltage ripple and transients on the transmission line.

Figures 5, 6:
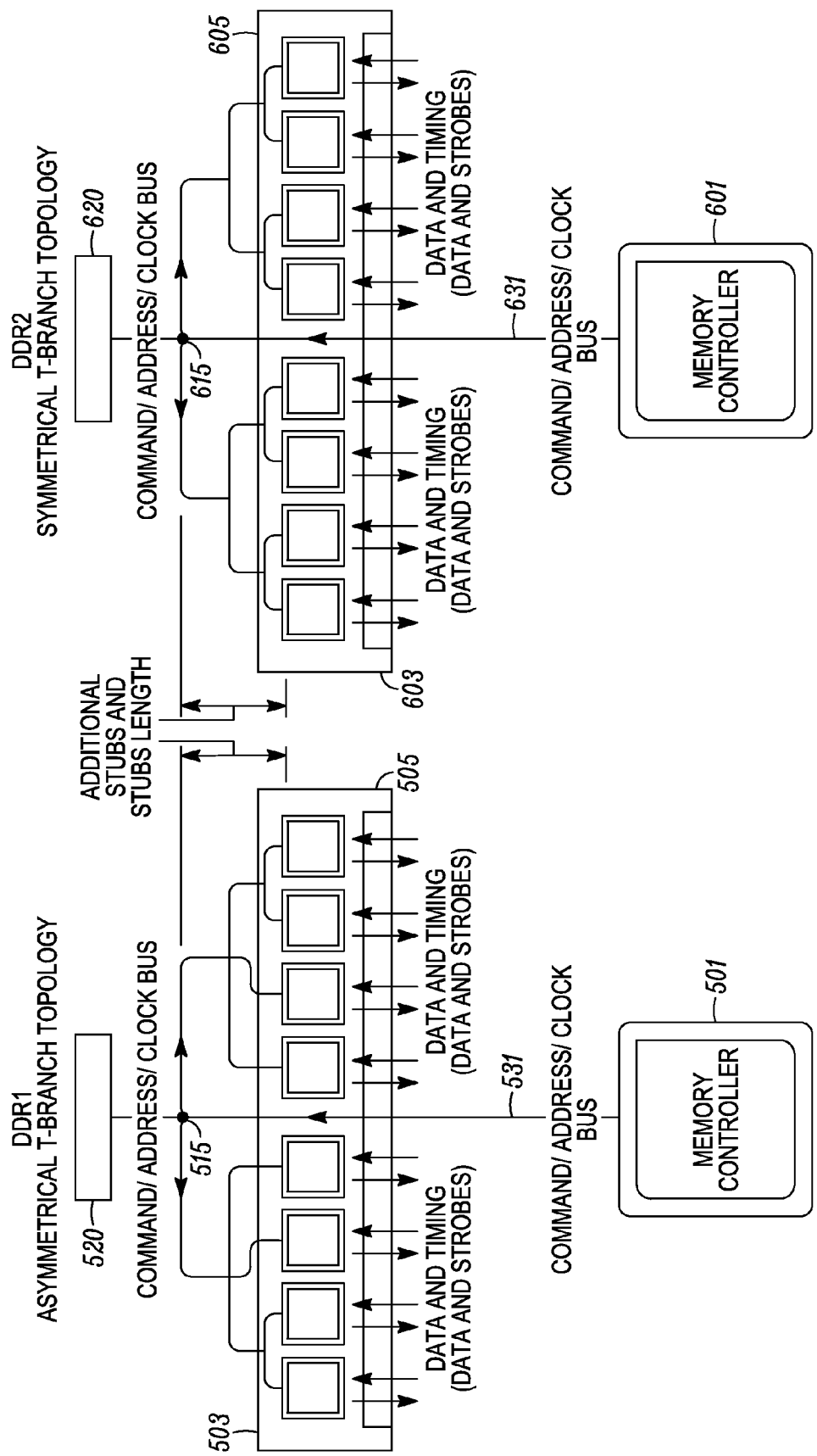
FIG. 5 is a view of an asymmetrical memory device.
FIG. 6 is a view of a symmetrical memory device.

FIG. 5 shows a schematic view of a memory device with asymmetrical, T-branch topology for its signal lines. The signal lines can be a bus 531 for all of the command, address and clock lines from the memory controller 501 to the memory units 503, 505. Each memory unit 503, 505 can be further divided into memory cells or groups of addressable memory. As shown the data and strobe lines can be separate from the bus 531. The bus 531 is branched at a node 515, e.g., a via, so that it can electrically connect the memory controller 501 to both of the memory units 503, 505. At the branch, the impedance matching circuitry 520 is connected. The impedance matching circuitry 520 is used to match impedance on the bus 531. Impedance matching circuitry 520 can include resistors, active components (e.g., transistors), and passive components, e.g., inductors and capacitors, that can be outside the integrated circuitry of the memory device so that the impedance matching is perfected using actual operating states of the memory device. In an example, the impedance matching circuitry 520 is located close to the node 515 and remote from the memory controller 501 and the memory units 503, 505.

FIG. 6 shows a schematic view of a memory device with symmetrical, T-branch topology for its signal lines, which is similar to the FIG. 5 embodiment but the signal lines after the node 615 are arranged symmetrically after the node 615. The signal lines can be a bus 631 for all of the command, address and clock lines from the memory controller 601 to the memory units 603, 605. Each memory unit 603, 605 can be further divided into memory cells or groups of addressable memory. As shown, the data and strobe lines can be separate from the bus 631. The bus 631 is branched at a node 615, e.g., a via, so that it can electrically connect the memory controller 601 to both of the memory units 603, 605. At the branch, the impedance matching circuitry 620 is connected. The impedance matching circuitry 620 is used to match impedance on the bus 631. Impedance matching circuitry 620 can include resistors and active components (inductors, capacitors, transistors, etc.) that can be outside the integrated circuitry of the memory device so that the impedance matching is perfected using actual operating states of the memory device. In an example, the impedance matching circuitry 620 is located close to the node 615 and remote from the memory controller 601 and the memory units 603, 605.

Figure 7:
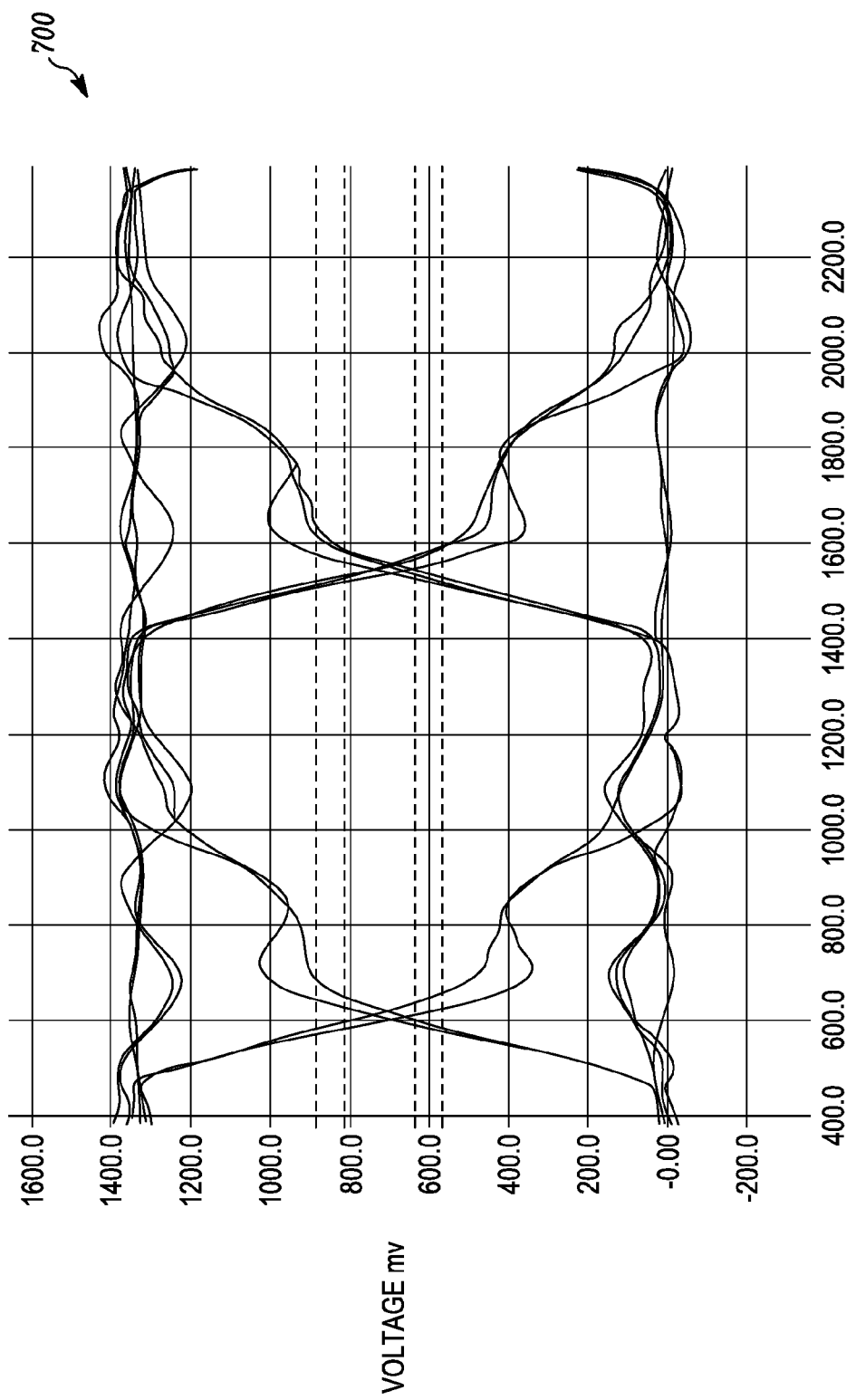
FIG. 7 shows signals on a conventional transmission line with on die termination.

FIG. 7 illustrates a graph 700 of signals on a conventional transmission line. For example, the graph 700 can have an eye width of about 905.114 ps with a high level of about 1.30 V and a low level of about 54.76 mV. The graph 700 shows an eye height of 1.04 V with a high level of 1.30 V, a low level of 54.76 mV and a sample eye height at 0.500 UI. The graph 700 can have an average rise time of about 386.151 ps, a minimum rise time of about 374.119 ps, a low voltage of about 304.6 mV, a maximum rise time of about 395.904 ps and a high voltage of about 1.05 V. The graph 700 can have an average fall time of 386.503 ps, minimum fall time of 374.111 ps, a high voltage of 1.05 V, a maximum fall time of about 396.980 ps, and a low voltage of 304.6 mV.

Figure 8:
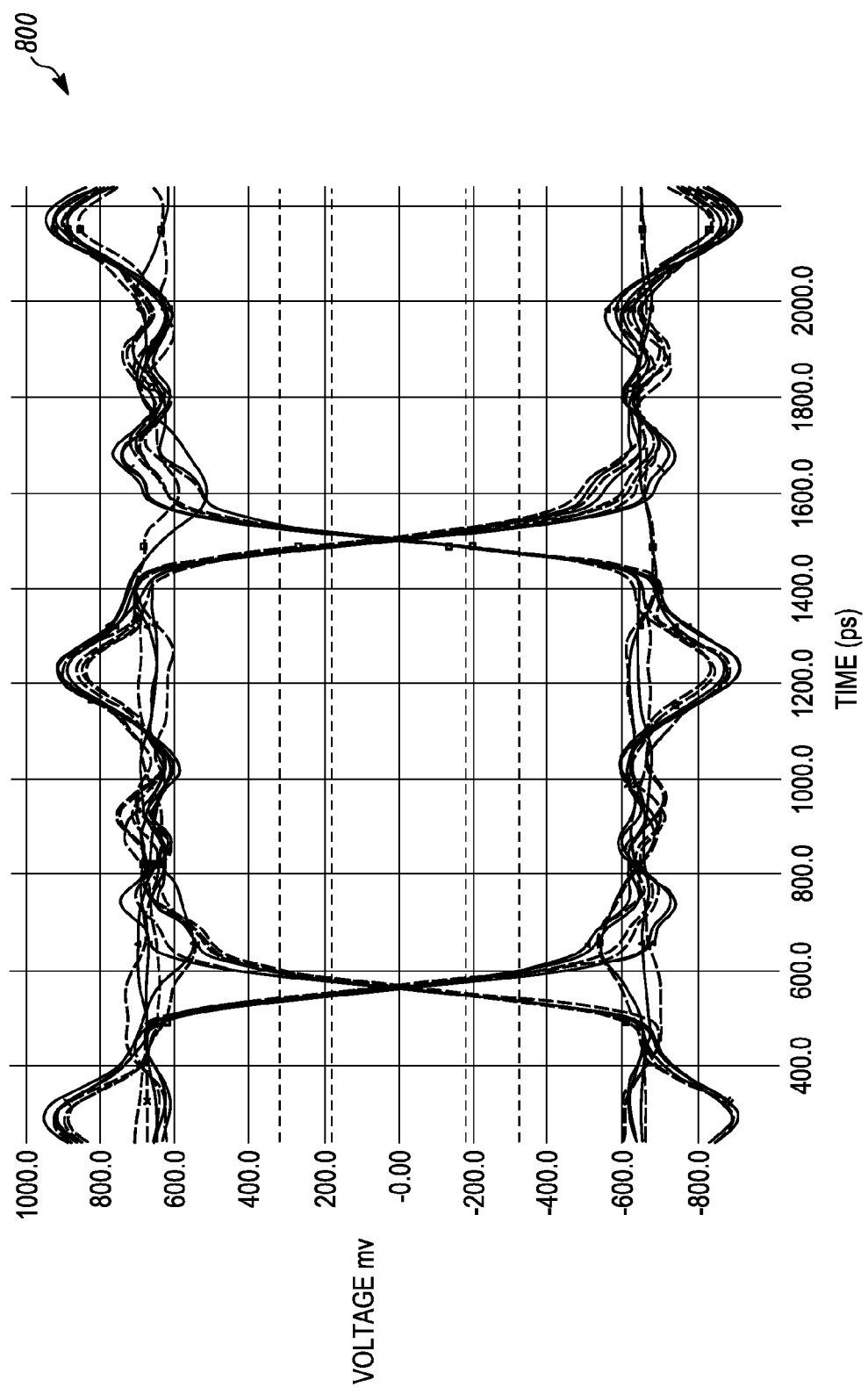
FIG. 8 shows on a transmission line according to examples of the present disclosure.

FIG. 8 shows a graph 800 of signals on a transmission line using the structures and methods described herein. As can be seen with comparison of graph 800 with graph 700, the graph 800, which depicts an example of the present invention, has improved performance as evidenced by its superior open eye pattern. Open eye patterns correspond to less noise on the signal line or less distortion in the line. The graph 800 shows an eye width of 930.322 ps with a high level of 654.4 mV and a low level of −650.2 mV. The graph 800 shows an eye height of 1.15 V with a high level of 654.4 mV, a low level of −650.2 mV and sample eye height at 0.500 UI. The graph 800 shows an average rise time of about 70.602 ps, a minimum rise time of about 63.414 ps, a low voltage: −389.3 mV, a maximum rise time of about 77.752 ps and a high voltage of about 393.5 mV. The graph 800 shows an average fall time of about 70.107 ps, a minimum fall time of 64.370 ps, a high voltage of 393.5 mV, a maximum fall time of 79.948 ps and a low voltage of −389.3 mV. The present example can have a sharper slew rate when viewed on the graph and is more periodic relative to transmission lines without the structures and methods as described herein. That is, the rise and fall times are decreased relative to conventional structures.

The systems and methods described herein can be used in various electronic devices that require accurate signals. One example is in memory systems that provide data for further processing. Another example is music players and infotainment systems, e.g., in vehicles. The signal integrity in such environments can affect the performance of the player of system, which can be noticeable to a user. Music players operate with a memory to retrieve data representing music through the signal lines. The music player then uses a codec to transform the retrieved data to a signal to be sent to speakers, which in turn convert the signal to audio signals that can be heard by a person.

It is believed that placing an impedance matching network at a mid-point location and not at the terminal ends of a signal line in an IC can improve signal integrity. By connecting the impedance matching network to the signal lines through a via at the point where two signal lines are joined allows the present structures to improve signal integrity after IC fabrication and based on actual production values of the IC. The impedance matching network can have discrete components that can be mounted to the board, e.g., PCB or FR4 board, and electrically connected to the via and signal lines. The present structure further minimally impacts the IC design or the board level design.

The impedance matching circuitry and networks described herein can be Thevenin equivalent circuits and can operate to reduce reflections in the signal lines. The impedance match circuitry can further match the characteristic impedance of the signal lines themselves.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electronic assembly comprising:
a memory device including a memory cell and a first communication line in electrical communication with the memory cell, wherein the first communication line is elongated and has a first end connected to the memory cell and a second end terminating at a via;
a substrate supporting the via and including a second communication line connected to the second end at the via and extending therefrom;
a first impedance matching circuit including a first Thevenin network connected to the first communication line; and
a second impedance matching circuit including a second Thevenin network connected to the first communication line, the second impedance matching circuit being different than the first impedance matching circuit, and the second impedance matching circuit including a plurality of different impedance paths connected at different depths to the via and selectable to tune an impedance of the second impedance matching circuit to match the second communication line.

2. The electronic assembly of claim 1, wherein the second impedance matching circuit is remote from the first end and remote from a third end of the second communication line.

3. The electronic assembly of claim 2, wherein the first impedance matching circuit is positioned at least 90% of a length of the first communication line from the first end.

4. The electronic assembly of claim 3, wherein the second impedance matching circuit is positioned at least 90% of a length of the second communication line from the third end of the second communication line.

5. The electronic assembly of claim 3, wherein the first impedance matching circuit is not in-die and includes discrete components positioned at the via on the substrate.

6. The electronic assembly of claim 1, wherein the memory stores music data and impedance matching circuit improves reliability of data being received by an infotainment system.

7. The electronic assembly of claim 1, wherein the memory is a component of a vehicle infotainment system.

8. The electronic assembly of claim 1, wherein the memory is a component of a mobile music player.

9. The electronic assembly of claim 1, wherein the first Thevenin network includes a pullup resistor and a pulldown resistor to increase signal integrity for both a high signal and a low signal.

10. A memory system comprising:
a memory controller;
a clock line with a first end connected to the memory controller and a second end at a via;
a first DDR memory device connected to the second end and having a first impedance;
a second DDR memory device connected to the second end and having a second impedance;
a first impedance matching circuitry including a first Thevenin network connected to the second end at the via and configured to match the first impedance;
a second impedance matching circuitry including a second Thevenin network connected to the second end at the via and configured to match the second impedance;
wherein the via includes a plurality of connections,
wherein the first impedance matching circuitry electrically connects at a first connection of the plurality of connections to select a first value for the first impedance; and
wherein the second impedance matching circuitry electrically connects at a second connection of the plurality of connections to select a second value for the second impedance.

11. The memory system of claim 10, wherein the first impedance matching circuitry includes a voltage divider with a center tap being connected to the via and wherein the voltage divider includes a pullup resistor and a pulldown resistor.

12. The memory system of claim 11, wherein the first impedance matching circuitry includes a capacitor in parallel with the voltage divider.

13. The memory system of claim 10, wherein the first impedance matching circuitry includes a voltage divider with a center tap being connected to the via.

14. The memory system of claim 13, wherein the first impedance matching circuitry is positioned intermediate the first memory device, the second memory device and a clock circuit and wherein the voltage divider includes a pullup resistor and a pulldown resistor.

15. A method comprising:
fixing a layout of a serpentine, elongate first communication line to meet electrical requirements for a high-speed system on a substrate;
electrically connecting a memory device to a first communication line, wherein the first communication line has a first end connected to a memory cell and a second end at a via;
electrically connecting a second communication line to the second end at a level of the via and extending therefrom; and
connecting a Thevenin impedance matching circuit to the second end with the impedance matching circuit being remote from the first end and remote from a third end of the second communication line, wherein the Thevenin impedance matching circuit boosts signal integrity at the second end for both a high level and a low level, wherein the connecting at the level of the via selects an impedance matching value for the Thevenin impedance matching circuit such that the impedance can be matched free of rerouting the first communication line or the second communication by selecting the impedance matching value.

16. The method of claim 15, wherein connecting the Theveinin impedance matching circuitry includes connecting a voltage divider with a center tap being connected to the second end at the selected level of the via.

17. The method of claim 16, wherein connecting the Thevenin impedance matching circuitry includes connecting a capacitor in parallel with the voltage divider.

18. The method of claim 15, further comprising connecting a clock to the third end and wherein the memory device is a DDR memory connected to the second end.

19. The method of claim 15, wherein the second communication line is connected to an infotainment system or a mobile music player processor.

* * * * *